United States Patent
Yang et al.

(10) Patent No.: US 7,098,824 B2
(45) Date of Patent: Aug. 29, 2006

(54) APPARATUS AND METHOD FOR DITHERING IMAGE SIGNALS IN COMBINATION WITH OFFSET

(75) Inventors: Steve Yang, Hsinchu Hsien (TW); Sterling Smith, Hsinchu (TW); Henry Tin-Hang Yung, HsinChu Hsien (TW)

(73) Assignee: Mstar Semiconductor, Inc., Hsinchu Hsien (TW)

( * ) Notice: Subject to any disclaimer, the term of this patent is extended or adjusted under 35 U.S.C. 154(b) by 104 days.

(21) Appl. No.: 10/663,719

(22) Filed: Sep. 17, 2003

(65) Prior Publication Data

US 2004/0056788 A1    Mar. 25, 2004

Related U.S. Application Data

(60) Provisional application No. 60/412,792, filed on Sep. 24, 2002.

(51) Int. Cl.
*H03M 1/20* (2006.01)
(52) U.S. Cl. .................. 341/131; 341/118
(58) Field of Classification Search ......... 341/126, 341/133, 118, 120, 155, 143, 169, 170, 131
See application file for complete search history.

(56) References Cited

U.S. PATENT DOCUMENTS

| 5,187,481 | A | * | 2/1993 | Hiller | 341/131 |
| 5,189,418 | A | * | 2/1993 | Bartz et al. | 341/131 |
| 5,905,453 | A | * | 5/1999 | Kase | 341/143 |
| 6,016,113 | A | * | 1/2000 | Binder | 341/131 |
| 6,064,328 | A | * | 5/2000 | Scheidig et al. | 341/155 |
| 6,175,321 | B1 | * | 1/2001 | Frannhagen et al. | 341/143 |
| 6,326,911 | B1 | * | 12/2001 | Gomez et al. | 341/143 |
| 6,577,257 | B2 | * | 6/2003 | Brooks | 341/131 |

* cited by examiner

*Primary Examiner*—Linh Van Nguyen
(74) *Attorney, Agent, or Firm*—Michael Bednarek; Pillsbury Winthrop Shaw Pittman LLP

(57) ABSTRACT

An apparatus and method for masking interference noise contained in a signal source. According to the present invention, the apparatus comprises: a pseudo random binary sequence generator for generating a digital dither signal; a scrambler for receiving an offset signal and generating a dithered offset signal by scrambling the offset signal with the digital dither signal; a digital-to-analog converter for converting the dithered offset signal into an analog dithered offset signal; a summing device for generating a dithered image signal in response to the analog dithered offset signal and the analog image signal; and an analog-to-digital converter for converting the dithered image signal into the digital image signal.

18 Claims, 2 Drawing Sheets

APPARATUS AND METHOD FOR DITHERING IMAGE SIGNALS IN COMBINATION WITH OFFSET

CROSS-REFERENCE TO RELATED APPLICATION

This application claims the priority benefits of U.S. provisional application titled "APPARATUS AND METHOD FOR MASKING INTERFERENCE NOISE CONTAINED IN SIGNAL SOURCE" filed on Sep. 24, 2002, Ser. No. 60/412,792. All disclosure of this application is incorporated herein by reference.

BACKGROUND OF THE INVENTION

1. Field of the Invention

The present invention generally relates to signal processing technology. More particularly, the present invention relates to an apparatus and method for masking interference noise contained in a signal source.

2. Description of the Prior Art

Currently, most personal computers utilize graphics cards that convert digital signals into RGB analog signals to be transmitted to a display device, such as a liquid crystal display (LCD), through a cable. The display device comprises an analog-to-digital converter (ADC) to convert the RGB analog signals into digital signals for displaying graphics or image. However, the RGB analog signals may suffer from interference noise, such as patterned or moving noise, which may be amplified during analog-to-digital conversion to cause "wave noise" on the display device. This may bring ripple or other visual effect to users' notice and thus significantly degrade display quality.

SUMMARY OF THE INVENTION

It is therefore an objective of the present invention to provide an apparatus and method for masking interference noise in a signal source by means of dithering approach.

For attaining the above objective, the present invention provides an apparatus for converting an analog image signal into a digital image signal. The apparatus comprises: a pseudo random binary sequence generator for generating a digital dither signal; a digital-to-analog converter for converting the digital dither signal into an analog dither signal; a summing device for generating a dithered image signal in response to the analog dither signal and the analog image signal; and an analog-to-digital converter for converting the dithered image signal into the digital image signal.

In addition, the present invention provides an apparatus for converting an analog image signal into a digital image signal. The apparatus comprises: a pseudo random binary sequence generator for generating a digital dither signal; a scrambler for receiving an offset signal and generating a dithered offset signal by scrambling the offset signal with the digital dither signal; a digital-to-analog converter for converting the dithered offset signal into an analog dithered offset signal; a summing device for generating a dithered image signal in response to the analog dithered offset signal and the analog image signal; and an analog-to-digital converter for converting the dithered image signal into the digital image signal.

Moreover, the present invention provides a method for converting an analog image signal into a digital image signal. The method comprises the following steps of: (a) generating a digital dither signal; (b) converting the digital dither signal into an analog dither signal; (c) adding the analog image signal with the analog dither signal to generate a dithered image signal; and (d) converting the dithered image signal into the digital image signal.

Furthermore, the present invention provides a method for converting an analog image signal into a digital image signal. The method comprising the following steps of: (a) generating a digital dither signal; (b) scrambling an offset signal with the digital dither signal to generate a dithered offset signal; (c) converting the dithered offset signal into an analog dithered offset signal; (d) adding the analog image signal with the analog dithered offset signal to generate a dithered image signal; and (e) converting the dithered image signal into the digital image signal.

BRIEF DESCRIPTION OF THE DRAWINGS

The accompanying drawings, which are incorporated in and form part of the specification in which like numerals designate like parts, illustrate preferred embodiments of the present invention and together with the description, serve to explain the principles of the invention. In the drawings.

DETAILED DESCRIPTION OF THE PREFERRED EMBODIMENTS

In the following detailed description of the preferred embodiments, reference is made to the accompanying drawings that form a part hereof, and in which is shown by way of illustration specific preferred embodiments in which the invention may be practiced. The preferred embodiments are described in sufficient detail to enable these skilled in the art to practice the invention, and it is to be understood that other embodiments may be utilized and that logical, changes may be made without departing from the spirit and scope of the present invention. The following detailed description is, therefore, not to be taken in a limiting sense, and the scope of the present invention is defined only by the appended claims.

Figure 1:
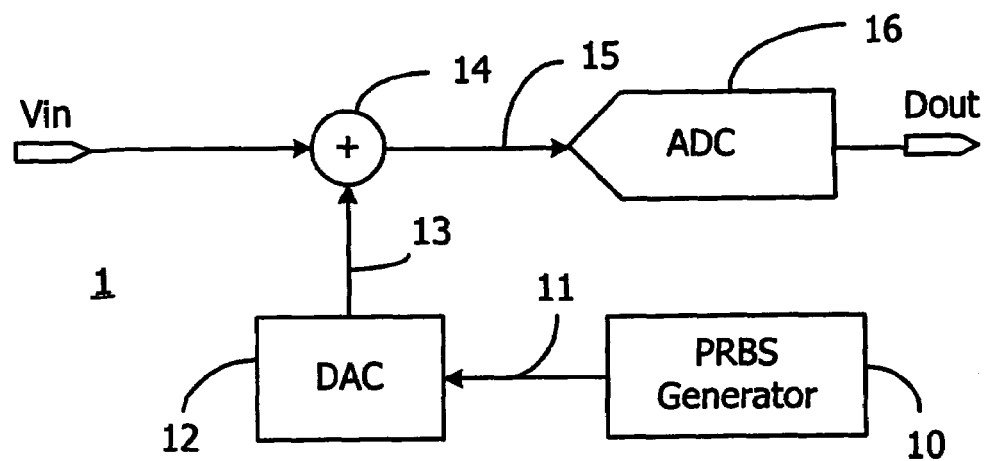
FIG. 1 schematically depicts a block diagram of a circuit 1 in accordance with one preferred embodiment of the present invention.

Referring to FIG. 1, a block diagram of a circuit 1 in accordance with one preferred embodiment of the present invention is schematically illustrated. The circuit 1 can be used in a digital display, such as a liquid display (LCD), and integrated in a display controller of the digital display, preferably. The circuit 1 is used to receive an analog image signal Vin and convert the analog image signal Vin into a digital image signal Dout through analog-to-digital conversion. It should be understood that the term "image signal" can represent any image signal, graphics signal, or video signal in the following description.

As shown in FIG. 1, the circuit 1 comprises a PRBS generator 10, a digital-to-analog converter (DAC) 12, a summing device 14, and an analog-to-digital converter (ADC) 16. The analog image signal Vin is received and processed by the circuit 1 so as to generate the digital image signal Dout. The analog image signal Vin can be provided by a computer host, a video cassette player, a VCD player, a DVD player or the like. However, the analog image signal Vin transmitted from various signal sources may suffer from interference noise, such as patterned or moving noise. The interference noise may be amplified during analog-to-digital conversion due to large quantizing gain of small noise signal. Accordingly, the digital image signal converted from the analog Dout bears the interference noise and causes wave noise on the digital display.

According to the present invention, the PRBS generator 10 is employed to generate a digital dither signal 11. Therefore, the digital dither signal 11 generated by the PRBS generator 10 is provided with pseudo random binary sequence (PRBS), which are semi-random sequences in the sense that they appear random within the sequence length, fulfilling the needs of randomness, but the entire sequence repeats indefinitely. The detailed circuit of the PRBS generator can be referred to R. N. Mutagi, "Pseudo Noise Sequences for Engineers," *Electronics & Communication Engineering Journal*, April 1996, pp. 79–87, which is incorporated herein by reference. In the application of the LCD controller, the pseudo-random sequences length is larger than the total pixel number of a image frame.

The DAC 12 is electrically connected to the PRBS generator 10 and the summing device 14. The DAC 12 is used to convert the digital dither signal 11 into a random-like dither signal 13 in analog form to be received by the summing device 14. Therefore, the analog dither signal 13 is incorporated with the analog image signal Vin at the summing device 14. Because the digital dither signal 11 provided with semi-random characteristic, the interference noise contained in the analog image signal Vin can be masked by adding the analog dither signal 13 so as to generate a masked image signal 15 by the summing device 12. The masked signal 15 is thereafter applied to the ADC 16 for further processing.

The ADC 16 receives the masked image signal 15 and converts the masked signal 15 into the corresponding digital image signal Dout. Because the interference noise has been masked by adding the analog image signal Vin with the analog dither signal 13, the digital image signal Dout converted from the masked image signal 15 has reduced interference noise.

Figure 2:
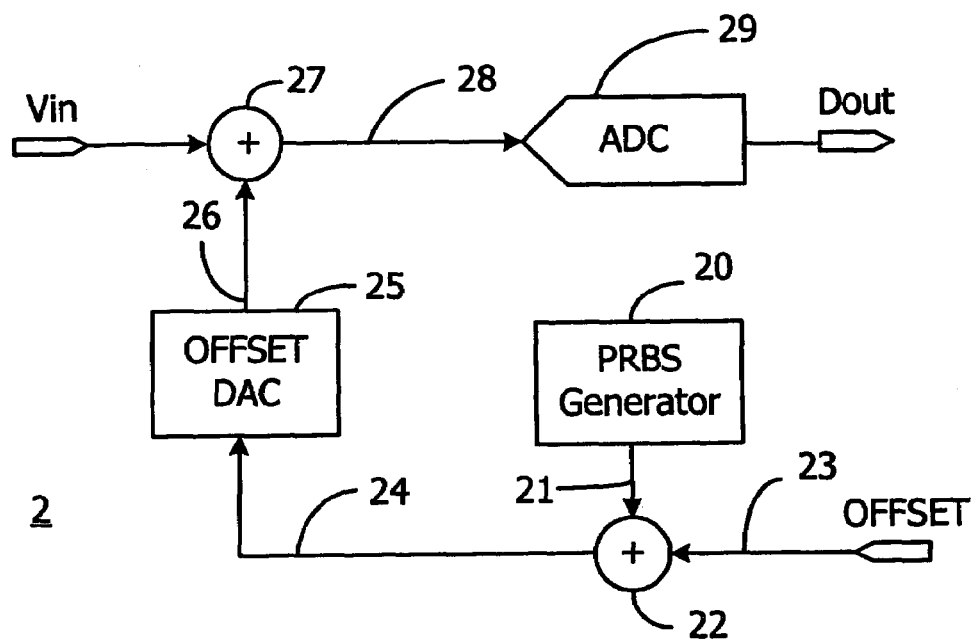
FIG. 2 schematically depicts a block diagram of a circuit 2 in accordance with another preferred embodiment of the present invention.

Referring to FIG. 2, a block diagram of a circuit 2 in accordance with another preferred embodiment of the present invention is schematically illustrated. In FIG. 2, the circuit 2 comprises a PRBS generator 20, an adder 22, an offset digital-to-analog converter (offset DAC) 25, a summing device 27 and an analog-to-digital converter (ADC) 29. The offset DAC 25 is preexisting in the display controller to process an offset signal OFFSET 23. In this embodiment, the offset DAC 25 is used to process offset and dither in low cost manner.

The offset signal 23 is generated by a microprocessor, which is responsive to brightness adjustment made by the user. As an example, the offset signal 23 is provided with 8 bits, OFFSET[7:0]. The adder 22 is used to add the offset signal 23 with a digital dither signal 21 generated by the PRBS generator 20, and generate a dithered offset signal 24.

The offset DAC 25 is used to convert the dithered offset signal 24 into a random-like dithered offset signal 26 in analog form to be received by the summing device 27. Therefore, the analog dithered offset signal 26 can be incorporated with the analog image signal Vin at the summing device 27. Because the digital dither signal 21 provided with semi-random characteristic, the interference noise contained in the analog image signal Vin can be masked by adding the analog dithered offset signal 26 so as to generate a masked image signal 28 by the summing device 27. The masked signal 28 is thereafter applied to the ADC 29 for further processing.

The ADC 29 receives the masked image signal 28 and converts the masked signal 328 into the corresponding digital image signal Dout. Because the interference noise has been masked by adding the analog image signal Vin with the analog dithered offset signal 26, the digital image signal Dout converted from the masked image signal 28 has reduced interference noise.

Figure 3:
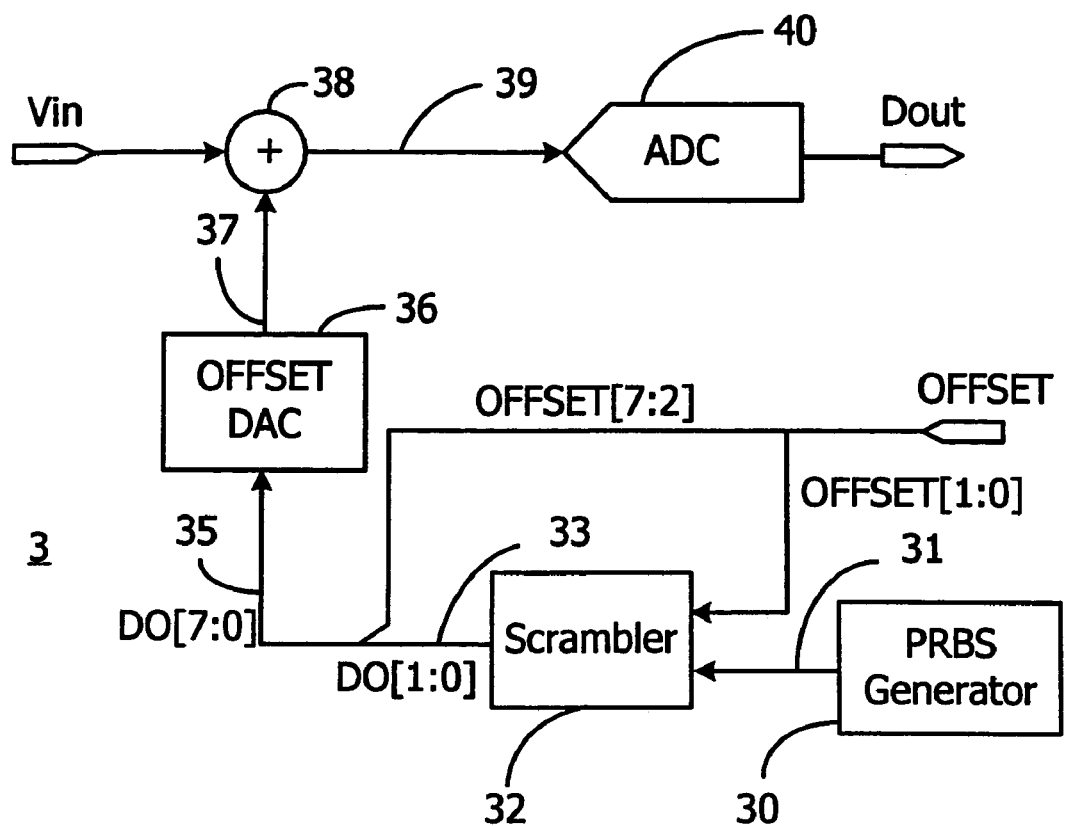
FIG. 3 schematically depicts a block diagram of a circuit 3 in accordance with one another preferred embodiment of the present invention.

Referring to FIG. 3, a block diagram of a circuit 3 in accordance with one another preferred embodiment of the present invention is schematically illustrated. In FIG. 3, the circuit 3 comprises a PRBS generator 30, a scrambler 32, an offset digital-to-analog converter (offset DAC) 36, a summing device 38 and an analog-to-digital converter (ADC) 40. The offset DAC 36 is preexisting in the display controller to process an offset signal OFFSET. In this embodiment, the offset DAC 36 is used to process offset and dither in low cost manner.

The offset signal OFFSET is generated by a microprocessor, which is responsive to brightness adjustment made by the user. As an example, the offset signal OFFSET is provided with 8 bits, OFFSET[7:0], wherein one LSB or two LSBs can be applied to the scrambler 32 to be scrambled with a digital dither signal 31 generated by the PRBS generator 20. As shown in FIG. 3, two LSBs OFFSET[1:0] are employed to scramble with the digital dither signal 31 at the scrambler 32 so as to generate a dither-incorporated signal 33, which is designated as DO[1:0]. The dither-incorporated signal DO[1:0] 33 and the OFFSET[7:2] are converged to form a dithered offset signal 35, which can be designated as DO[7:0].

The offset DAC 36 is used to convert the dithered offset signal 35 into a random-like dithered offset signal 37 in analog form to be received by the summing device 38. Therefore, the analog dithered offset signal 37 can be incorporated with the analog image signal Vin at the summing device 38. Because the digital dither signal 31 provided with semi-random characteristic, the interference noise contained in the analog image signal Vin can be masked by adding the analog dithered offset signal 37 so as to generate a masked image signal 39 by the summing device 38. The masked signal 39 is thereafter applied to the ADC 40 for further processing.

The ADC 40 receives the masked image signal 39 and converts the masked signal 39 into the corresponding digital image signal Dout. Because the interference noise has been masked by adding the analog image signal Vin with the analog dithered offset signal 37, the digital image signal Dout converted from the masked image signal 39 has reduced interference noise. In addition, the circuit as depicted in FIG. 3 can solve nonlinear DAC problem by restricting PRBS effect to LSB only.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An apparatus for converting an analog image signal into a digital image signal, said apparatus comprising:
   a pseudo random binary sequence generator for generating a digital dither signal having a pseudo-random sequence length;
   a scrambler for scrambling said digital dither signal with an offset signal so as to generate a dithered offset signal;

a digital-to-analog converter for converting said dithered offset signal into an analog dithered offset signal;

a summing device for generating a dithered image signal in response to said analog dithered offset signal and said analog image signal; and an analog-to-digital converter for converting said dithered image signal into said digital image signal having a frame length;

wherein said pseudo-random sequence length is substantially greater than said frame length.

2. The apparatus as claimed in claim 1, wherein said summing device is used to add said analog image signal with said analog dithered offset signal.

3. The apparatus as claimed in claim 1, wherein said scrambler is used to scramble at least one least significant bit of said offset signal with said digital dither signal.

4. An apparatus for converting an analog image signal into a digital image signal, said apparatus comprising:

a pseudo random binary sequence generator for generating a digital dither signal having a pseudo random sequence length;

an adder for adding said digital dither signal with an offset signal so as to generate a dithered offset signal;

a digital-to-analog converter for converting said dithered offset signal into an analog dithered offset signal;

a summing device for generating a dithered image signal in response to said analog dithered offset signal and said analog image signal; and an analog-to-digital converter for converting said dithered image signal into said digital image signal having a frame length;

wherein said pseudo-random sequence length is substantially greater than said frame length.

5. The apparatus as claimed in claim 4, wherein said summing device is used to add said analog image signal with said analog dithered offset signal.

6. The apparatus as claimed in claim 4, wherein said adder is used to add at least one least significant bit of said offset signal with said digital dither signal.

7. A method for converting an analog image signal into a digital image signal, said method comprising the following steps of:

(a) generating a digital dither signal having a pseudo random sequence length;

(b) scrambling said digital dither signal with an offset signal so as to generate a dithered offset signal;

(c) converting said dithered offset signal into an analog dithered offset signal;

(d) adding said analog image signal with said analog dithered offset signal to generate a dithered image signal; and (e) converting said dithered image signal into said digital image signal having a frame length;

wherein said pseudo random sequence length is substantially greater than said frame length.

8. The method as claimed in claim 7, wherein said digital dither signal is provided with pseudo random binary sequence.

9. The method as claimed in claim 7, wherein at least one least significant bit of said offset signal is scrambled with said digital dither signal in step (b).

10. A method for converting an analog image signal into a digital image signal, said method comprising the following steps of:

(a) generating a digital dither signal having a pseudo random sequence length;

(b) adding said digital dither signal with an offset signal so as to generate a dithered offset signal;

(c) converting said dithered offset signal into an analog dithered offset signal;

(d) adding said analog image signal with said analog dithered offset signal to generate a dithered image signal; and (e) converting said dithered image signal into said digital image signal having a frame length;

wherein said pseudo random sequence length is substantially greater than said frame length.

11. The method as claimed in claim 10, wherein said digital dither signal is provided with pseudo random binary sequence.

12. The method as claimed in claim 10, wherein at least one least significant bit of said offset signal is added with said digital dither signal in step (b).

13. An apparatus for converting an analog image signal into a digital image signal, said apparatus comprising:

a pseudo random binary sequence generator for generating a digital dither signal having a pseudo random sequence length;

a digital-to-analog converter for converting said digital dither signal into an analog dither signal;

a summing device for generating a dithered image signal in response to said analog dither signal and said analog image signal; and an analog-to-digital converter for converting said dithered image signal into said digital image signal having a frame length;

wherein said pseudo random sequence length is substantially greater than said frame length.

14. The apparatus as claimed in claim 13, wherein said summing device is used to add said analog image signal and said analog dither signal.

15. The apparatus as claimed in claim 13, wherein said digital dither signal is a dithered offset signal.

16. A method for converting an analog image signal into a digital image signal, said method comprising the following steps of:

(a) generating a digital dither signal having a pseudo random sequence length;

(b) converting said digital dither signal into an analog dither signal;

(c) generating a dithered image signal in response to said analog image signal and said analog dither signal; and (d) converting said dithered image signal into said digital image signal having a frame length;

wherein said pseudo random sequence length is substantially greater than said frame length.

17. The method as claimed in claim 16, wherein said dithered image signal is generated by adding said analog image signal and said analog dither signal in step (c).

18. The method as claimed in claim 16, wherein said digital dither signal is a dithered offset signal.

* * * * *